(12) United States Patent
Popp et al.

(10) Patent No.: US 8,802,566 B2
(45) Date of Patent: Aug. 12, 2014

(54) METHOD FOR PRODUCING SEMICONDUCTOR COMPONENTS ON A SUBSTRATE, AND SUBSTRATE COMPRISING SEMICONDUCTOR COMPONENTS

(75) Inventors: Martin Popp, Chur (CH); Beat De Coi, Sargans (CH); Marco Annese, Chur (CH)

(73) Assignee: Espros Photonics AG, Sargans (CH)

( * ) Notice: Subject to any disclaimer, the term of this patent is extended or adjusted under 35 U.S.C. 154(b) by 0 days.

(21) Appl. No.: 13/593,933

(22) Filed: Aug. 24, 2012

(65) Prior Publication Data

US 2013/0049171 A1 Feb. 28, 2013

Related U.S. Application Data

(60) Provisional application No. 61/527,827, filed on Aug. 26, 2011.

(30) Foreign Application Priority Data

Aug. 26, 2011 (EP) ..................................... 11006972

(51) Int. Cl.
*G03F 7/20* (2006.01)
*H01L 29/96* (2006.01)
*H01L 21/3213* (2006.01)
*H01L 21/033* (2006.01)

(52) U.S. Cl.
CPC ...... *H01L 21/32139* (2013.01); *H01L 21/0038* (2013.01); *H01L 21/0337* (2013.01)
USPC ........... 438/671; 438/673; 430/312; 430/313; 430/315; 430/319; 257/618

(58) Field of Classification Search
CPC .. H01I 21/033; H01I 21/0337; H01I 21/0338; H01I 21/31144; H01I 21/32139
USPC .................. 438/314, 316, 671, 673, 701, 713; 430/312, 313, 315
See application file for complete search history.

(56) References Cited

U.S. PATENT DOCUMENTS

| | | |
|---|---|---|
| 6,399,286 B1 | 6/2002 | Liu et al. |
| 2006/0216922 A1 | 9/2006 | Tran et al. |
| 2008/0230516 A1 | 9/2008 | Cho et al. |

OTHER PUBLICATIONS

European Search Report dated Nov. 2, 2011.

*Primary Examiner* — Tom Thomas
*Assistant Examiner* — John Bodnar
(74) *Attorney, Agent, or Firm* — Burr & Brown, PLLC

(57) ABSTRACT

A method for producing semiconductor components on a substrate including photolithographic patterning steps, in which method, on the substrate, a first layer to be patterned is applied and a second layer serving as a mask layer for the first layer to be patterned is applied, wherein a third layer serving as a mask for the second layer is applied, and wherein at least two photolithographic patterning processes are carried out successively for the second layer, wherein, during one of the patterning processes, after the production of a structure made from a photosensitive layer for the provision of a mask layer for a patterning process at the third layer, positive ramp angles α are produced at the patterning edges of the third layer, as a result of which the structures remaining free, given a thickness h of the third layer, decrease in size by a value $D=2*h/\tan\alpha$.

10 Claims, 2 Drawing Sheets

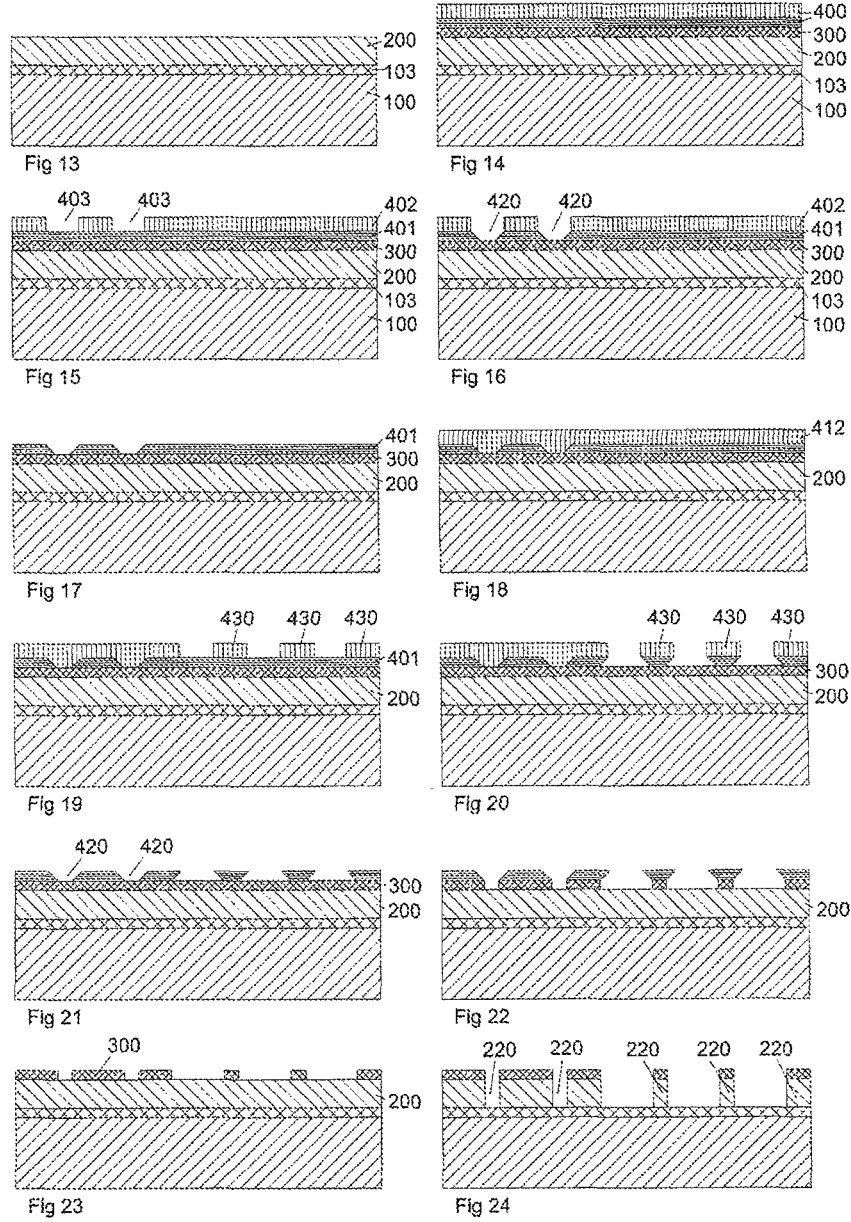

METHOD FOR PRODUCING SEMICONDUCTOR COMPONENTS ON A SUBSTRATE, AND SUBSTRATE COMPRISING SEMICONDUCTOR COMPONENTS

CROSS REFERENCE TO RELATED APPLICATIONS

This application claims the benefit under 35 USC §119(e) of U.S. Provisional Application 61/527,827, filed Aug. 26, 2011, and claims the benefit under 35 USC §119(a)-(d) of European Application No. 11 006 972.1 filed Aug. 26, 2011, the entireties of which are incorporated herein by reference.

FIELD OF THE INVENTION

The invention relates to a method for producing semiconductor components on a substrate, and a substrate comprising semiconductor components.

BACKGROUND OF THE INVENTION

In semiconductor production, it is known to produce structures on a wafer surface by means of photolithographic processes. By way of example, structures are projected onto a photosensitive layer by means of a photolithographic stepper or scanner. Alongside other structures, gate regions of transistor gates of integrated circuits are regularly produced by means of a photolithographic process on the basis of the patterning of a polysilicon layer on the surface of a dielectric, for example, silicon oxide or silicon oxynitride. The minimum achievable sizes for line structures and equally the minimum achievable distances between adjacent line structures are limited by the parameters of a photolithographic system. One limiting factor is, for example, the prevailing wavelength for the illumination for a light source during the projection of the structures onto the surface of a substrate to be patterned. In addition, mechanical tolerances and the aperture of the optical path are limiting factors. For an existing photolithographic system, the minimum achievable feature size is a fixed parameter designated as the critical dimension. A critical gap dimension is regularly approximately of the order of magnitude of a critical line dimension. Semiconductor processes are often specified exactly according to these parameters, e.g. 200 nm technology node or 90 nm technology node.

The transition to a technology with a smaller critical dimension is very expensive, for which reason attempts are made to be able to achieve the smallest possible dimensions in the existing technology.

For the properties, for example, a transistor, it may be advantageous to achieve a gate channel length that is as small as possible. With a smaller gate channel length it is possible to reduce the necessary supply voltage, as a result of which the power consumption decreases. Furthermore, it is possible to increase the clock rate.

In the attempt to achieve smaller structures, however, the disadvantage arises when the distance between the structures increases, that is the gap width between the structures increases. In specific applications, there is a desire precisely for a distance that is as small as possible between gate structures, for example, the case of CCDs (Charge coupled devices). In order to achieve this, the prior art discloses using a technology in which a double gate patterning process is employed. The overlapping of two gate structures makes it possible to produce a minimum distance between the gates.

In this process, however, the performance of standard transistors is detrimentally affected on account of a required high-temperature oxidation process for producing an oxide spacer between two polysilicon layers.

Furthermore, it is possible to use an improved photolithographic process which enables smaller structures to be realized. However, this is associated with a significant additional outlay in respect of costs.

SUMMARY OF THE INVENTION

The present invention is based on the object of improving a photolithographic process for producing semiconductor structures having a predetermined critical dimension for gaps and lines with regard to the size of the critical dimension.

The present invention is based on a method for producing semiconductor components on a substrate comprising photolithographic patterning steps, in which method, on the substrate, a first layer to be patterned is applied and a second layer serving as a mask layer for the first layer to be patterned is applied. The first layer to be patterned is e.g. a polysilicon layer which can be used later in the method for the production of transistor gates. The substrate is, for example, a silicon wafer which is prepared in a known manner, and contains doped regions, etched structures and gaps filled with an insulator. In addition, before the polysilicon is applied, a further insulation layer can be applied which serves, for example, as a transistor dielectric.

The second layer can be an oxide layer composed of silicon oxide or silicon oxynitride.

The heart of the present invention resides, then, in the fact that a third layer serving as a mask for the second layer is applied, and wherein at least two photolithographic patterning processes are carried out successively for the second layer, wherein, during one of the patterning processes, after the production of a structure made from a photosensitive layer for the provision of a mask layer for a patterning process at the third layer, positive ramp angles are produced at the patterning edges of the third layer, as a result of which the structures remaining free, given a thickness h of the third layer, decrease in size by a value $D=2*h/\tan\alpha$, and wherein, during the other of the patterning processes, after the production of a structure made from a photosensitive layer for the provision of a mask layer for a patterning process at the third layer, negative ramp angles $\beta$ are produced at the patterning edges of the third layer, wherein the remaining structures, given a thickness h of the third layer, decrease in size by a value $W=2*h/\tan\beta$, and wherein the second layer is patterned on the basis of the respectively patterned third layer.

During this patterning operation it is conceivable that after the first patterning process, the third layer is completely removed after it has been patterned and used as a mask for patterning the second layer and a new third layer is applied, which is patterned anew in the further second patterning process. In this case, it is completely insignificant whether the structures with the positive or negative ramp angle are produced first.

As a result of this procedure it is possible that on a substrate, as a result of the enlargements and size reductions of the structures at the third layer, gap widths and/or line widths of the structures in the second layer can be produced which are less than the minimum critical dimensions which are usually achievable for a mask step.

It is furthermore preferred that after the first of the patterning processes, before the second patterning process, the photosensitive layer for providing the mask is removed. If appropriate, not only the photosensitive layer for providing the mask for the third layer but also the third layer is completely removed and both layers, the third layer and also the photosensitive patterning layer are applied anew.

In a furthermore preferred configuration of the present invention, it is preferred that after the patterning of the third layer, a patterning of the second layer is performed via the third layer as a mask, in order thus to generate a mask for the first layer. It is conceivable to perform this patterning process in each case after the patterning of the third layer or else to leave the third layer until both the minimum gaps and minimum lines have been produced and then to perform a patterning of the second layer in one step.

By way of example, a polymer layer can be applied as a third layer. Preferably, a layer is used which has the properties of an antireflection coating, for example, a BARC layer (bottom antireflex coating).

This method is used as a basis preferably for producing substrates comprising semiconductor components comprising structures which have feature sizes for lines and gaps which substantially correspond to the feature sizes of the photolithographic masks used for producing the structures, but feature sizes which are significantly less than the minimum feature sizes of the photolithographic masks used for lines and gaps of the masks used are also realized on the same substrate.

In particular, substrates comprising semiconductor components are realized wherein transistor structures having channel lengths below the minimum feature sizes of the photolithographic masks used are provided, and wherein gate structures for transistors whose distances are below minimum distances which are provided by the photolithographic masks used for producing the structures are present in the same plane in the substrate.

BRIEF DESCRIPTION OF THE DRAWINGS

FIGS. 13 to 24 are schematic sectional diagrams showing the sequence of a further method according to the present invention for producing semiconductor components on a substrate with feature sizes which are less than the critical dimensions.

DETAILED DESCRIPTION OF THE INVENTION

Figure 1:
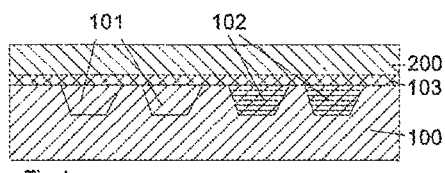
FIGS. 1 to 12 are schematic sectional diagrams showing the sequence of a method according to the present invention for producing semiconductor components on a substrate with feature sizes which are less than the critical dimensions.

The starting point is a wafer 100 composed of silicon having doped regions 101, etched structures 102, which are used as active regions of a transistor, in which the gaps between the etched structures are filled with insulation material, in processes such as STI (shallow trench isolation) or LOCOS (Local oxidation of silicon). A dielectric 103, serving as a dielectric for transistor structures, can be applied to the wafer 100. Finally, this insulation layer is followed by a layer 200 composed of polysilicon, for example, which is used later for producing the gate of the transistors, for example, with a thickness of 200 nm.

Afterward, an insulation layer, in particular a silicon oxide layer 300, is applied to the layer 200. This layer should have chemical properties which are different than those of the underlying layer 200 and has a thickness of 50 nm. Thus, after its patterning, layer 300 can be used as a mask for the patterning of the underlying layer 200.

Figure 2:
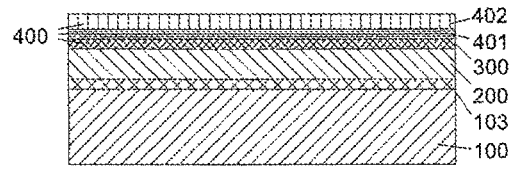

A layer stack 400 is applied thereon, which layer stack can consist of different layers, for example, an antireflection coating 401 and a photoresist layer 402 (see FIG. 2).

The photoresist layer 402 is patterned in order to obtain a first mask for the underlaying layer 401. In this case, only the structures with which gap widths smaller than the critical dimension are intended to be created or realized in the photoresist layer. It goes without saying that this mask step can also be used to produce structures which are larger than the minimum structure. Furthermore, structures having a size of the minimum lines with regard to the critical dimension thereof can arise in this mask step. In principle, the criterion of the minimum feature size is complied with during the photolithographic process. The feature sizes smaller than the minimum feature size arise as a result of a subsequent patterning step on the basis of a photolithographic process in the region of the minimum possible feature sizes.

Figure 3:
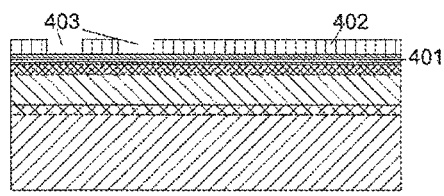
Figure 4:
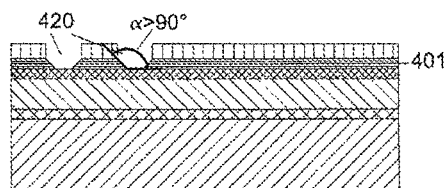

A patterned photoresist layer 402 with openings 403 ultimately remains (see FIG. 3). The layer 401 is then patterned using this patterned photoresist layer. A preferred etching step advantageously takes place in such a way that a positive ramp angle arises in the layer 401 at the edges of the structures. This produces in the layer 401 openings 420 which substantially have a constant offset of D=2*h/tan α, where h is the thickness of the layer 401. The angle α is by definition the angle formed by the oblique boundary of the layer 401 and the plane of the wafer. That means that an angle α>90° corresponds to a positive ramp angle, in the case of which openings 420 having a reduced size arise, whereas at an angle α<90° a negative ramp angle is present, in the case of which openings increase in terms of dimension. In FIG. 4, openings 420 are reduced in size at any rate in the present step. The ramp angle is positive (see FIG. 4).

Figure 5:
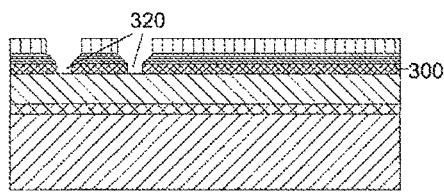
Figure 6:
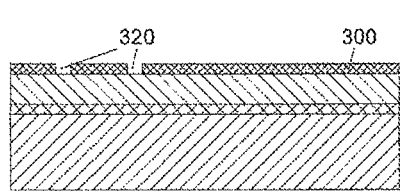

The underlying layer 300 (mask layer) is patterned using the patterned layer 401. This results in structures 320 (openings) in the layer 300 which correspond to the openings 420 in the layer 401 at the layer base thereof (see FIGS. 5 and 6). In FIG. 6, the layer 402 and 401, respectively, is completely removed before the next process step.

Figure 7:
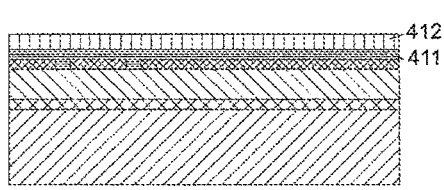
Figure 8:
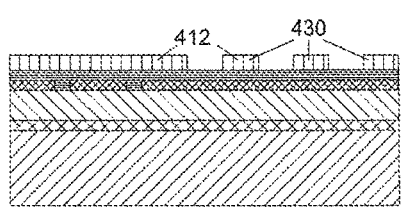

In accordance with FIG. 7, a layer 411 and 412, respectively, is applied, wherein the layer 411 corresponds to the layer 401 and the layer 412 corresponds to the layer 402. The layer 412 is a photoresist layer which is patterned in accordance with the structures in which the intention is to achieve a line width smaller than a line width which is still possible according to the critical dimension (see FIG. 8). Lines 430 can be seen in FIG. 8. These lines 430 are greater than or equal to the minimum line width using the photolithographic possibilities.

Figure 9:
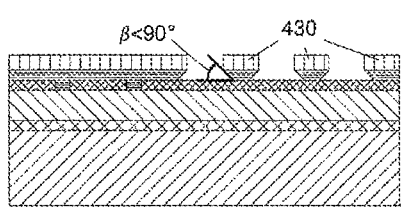
Figure 10:
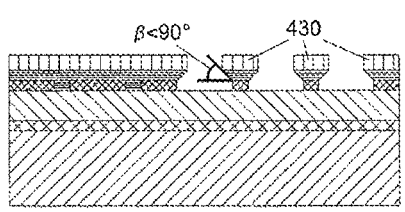
Figure 11:
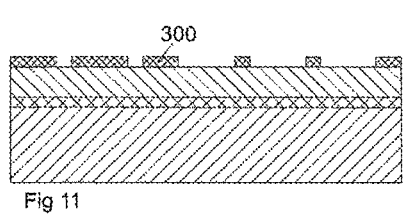
Figure 12:
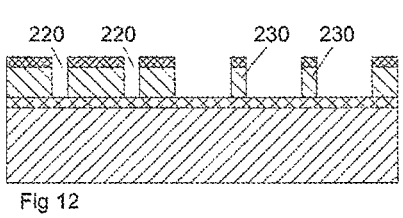

Using the patterned layer 412 with lines 430, the underlying layer 411 is patterned in such a way that negative ramp angles arise. As a result, the remaining lines 430 decrease in size by in each case the ramp angle range, that is to say that the lines become smaller by the value W=2*h/tan β, where β is the angle between the substrate surface and the inwardly inclined edge (see FIGS. 9 and 10).

Using the patterned lines 430 in the layer 411, the underlying layer 300 is patterned anew, wherein the width of the lines at the lower edge at the transition to the layer 300 is transferred to the underlying layer 300. Subnominal line structures that are smaller than the photolithographic line width arise.

Subsequently, the layers 412 and 411 are completely removed and a renewed patterning operation is carried out using the patterned layer 300.

The layer 300 now contains subnominal gap widths and subnominal line widths in comparison with a critical dimension at the predetermined locations. Of course, the layer 300 can contain larger structures and also structures which correspond to the critical dimension.

Using the patterned layer 300, the underlying layer 200 is patterned, with which the gates of the transistors are produced.

It is subsequently possible to remove the layer 300 to leave a patterned polysilicon layer 200 having subnominal gaps 220 and subnominal lines 230.

A conventional CMOS process can subsequently be carried out.

In order to use the minimum structures, an implantation for producing source/drain regions in the regions of subnominal gap widths should subsequently be avoided.

In the method in accordance with FIGS. 13 to 24, the same layers are employed as in the method in accordance with FIGS. 1 to 12, for which reason the same reference symbols are used for the layers and the structures. What are different from the production method according to FIGS. 1 to 12 in the production method according to FIGS. 13 to 24 are the process sequence and the layer sequence. The production method illustrated by FIGS. 13 to 16 corresponds to that in FIGS. 1 to 4. In contrast to the method in accordance with FIGS. 1 to 12, however, the underlying mask layer 300 is not patterned by means of the patterned layer 401 after the production of the openings 420, rather the photoresist layer 402 is completely removed (see FIG. 17) and a renewed photoresist layer (412) is applied. As in the method in accordance with FIGS. 1 to 12, the layer 412 is patterned in accordance with the structures in which the intention is to achieve a line width smaller than a line width which is still possible photolithographically according to the critical dimension. Lines 430 can be seen in FIG. 19. These lines 430 are greater than or equal to the minimum line width using the photolithographic possibilities.

Using the patterned layer 412 with lines 430, the underlying layer 400 is patterned in such a way that negative ramp angles arise. As a result, the remaining lines 430 decrease in size by in each case the ramp angle range (see FIG. 20). The photoresist layer 420 is subsequently removed (see FIG. 21), a patterned layer 401 remaining which is used to pattern the underlying layer 300 (mask layer). In accordance with the width of the openings and lines, respectively, at the base of the layer, these dimensions are transferred to the layer 300 in the patterning process, to be precise in a single patterning step, whereas two patterning steps are employed for the layer 300 in the method in accordance with FIGS. 1 to 12.

The patterned layer 300 can be seen in FIG. 22. The further process sequence in accordance with FIGS. 23 and 24 then corresponds once again to the process sequence in accordance with FIGS. 11 and 12.

LIST OF REFERENCE SYMBOLS

100 Wafer
101 Doped regions
102 Structures
103 Dielectric
200 Polysilicon
220 Subnominal gaps
230 Subnominal line
300 Mask layer
320 Structures
400 Layer stack
401 BARC layer
402 Photoresist
403 Opening
411 BARC layer
412 Photoresist
420 Opening
430 Line

The invention claimed is:

1. A method for producing semiconductor components on a substrate using photolithographic patterning, the method comprising the steps of:
    providing a substrate;
    providing a first layer to be patterned on the substrate;
    providing a second layer as a mask layer for the first layer on the first layer;
    providing a third layer as a mask layer for the second layer on the second layer;
    patterning the third layer by
        performing at least a first photolithographic patterning process to produce a first photosensitive layer structure on the third layer to define a first mask, whereby positive ramp angles $\alpha$ are produced at patterning edges of the third layer, wherein exposed portions of the third layer, given a thickness h of the third layer, decrease in size by a value $D=2*h/\tan \alpha$, and
        performing at least a second photolithographic patterning process to produce a second photosensitive layer structure on the third layer to define a second mask, whereby negative ramp angles $\beta$ are produced at the patterning edges of the third layer, wherein remaining portions of the second photosensitive layer structure, given a thickness h of the third layer, decrease in size by a value $W=2*h/\tan \beta$; and
    patterning at least a portion of the second layer via the respectively patterned third layer.

2. The method as claimed in claim 1, wherein after one of the first and the second photolithographic patterning processes, before the other of the first and the photolithographic second patterning process, the photosensitive layer for providing the respective mask is removed.

3. The method as claimed in claim 1, wherein after the first and the second photolithographic patterning processes of the third layer, the second layer is patterned, via the third layer as a mask, to define a mask for the first layer.

4. The method as claimed in claim 1, wherein the second layer is patterned directly after each of the first and the second photolithographic patterning processes of the third layer.

5. The method as claimed in claim 1, wherein the first layer is a polysilicon layer.

6. The method as claimed in claim 1, wherein the second layer is a silicon oxide layer.

7. The method as claimed in claim 1, wherein the first layer is patterned with the second layer.

8. The method as claimed in claim 1, wherein the third layer is a polymer layer.

9. The method as claimed in claim 1, further comprising the steps of:
    removing the third layer after performing a first one of the first and the second photolithographic patterning processes;
    providing a new third layer as a mask layer for the second layer on the second layer, which has been at least partly patterned by the first one of the first and the second photolithographic patterning processes; and
    performing the other one of the first and the second photolithographic patterning processes.

10. The method as claimed in claim 1, further comprising the steps of:
    removing a respective one of the first or the second photosensitive layers of a respective one of the first or second photosensitive layer structures after performing a first one of the first and the second photolithographic patterning processes;
providing a new photosensitive layer on the third layer;
performing the other one of the first and the second photolithographic patterning processes.

* * * * *